United States Patent
Higuchi

(10) Patent No.: US 11,664,231 B2
(45) Date of Patent: May 30, 2023

(54) METHOD FOR MANUFACTURING SEMICONDUCTOR DEVICE

(71) Applicant: KABUSHIKI KAISHA TOSHIBA, Tokyo (JP)

(72) Inventor: Kazuhito Higuchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/655,083

(22) Filed: Mar. 16, 2022

(65) Prior Publication Data

US 2023/0084019 A1   Mar. 16, 2023

(30) Foreign Application Priority Data

Sep. 14, 2021 (JP) .............................. JP2021-149601

(51) Int. Cl.
| | |
|---|---|
| *H01L 21/288* | (2006.01) |
| *H01L 21/768* | (2006.01) |
| *C25D 3/12* | (2006.01) |
| *C25D 5/02* | (2006.01) |
| *C25D 3/38* | (2006.01) |
| *C25D 7/12* | (2006.01) |

(52) U.S. Cl.
CPC ............ *H01L 21/2885* (2013.01); *C25D 3/12* (2013.01); *C25D 3/38* (2013.01); *C25D 5/02* (2013.01); *C25D 7/12* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 10,233,557 B2 | 3/2019 | Higuchi et al. | |
| 2014/0374904 A1* | 12/2014 | Matsumoto | ....... H01L 21/76871 204/232 |
| 2016/0177467 A1* | 6/2016 | Changchien | ........... C25D 5/003 205/99 |

(Continued)

FOREIGN PATENT DOCUMENTS

JP   6400512 B2   10/2018

OTHER PUBLICATIONS

Ho-Chiao Chuang et al 2015 J. Micromech. Microeng. 25 015004 (Year: 2015).*

(Continued)

*Primary Examiner* — Louis J Rufo
(74) *Attorney, Agent, or Firm* — Oblon, McClelland, Maier & Neustadt, L.L.P.

(57) ABSTRACT

According to one embodiment, there is provided a method for manufacturing a semiconductor device. The method includes metal electroplating on a surface of a first electrode formed on a first surface of a semiconductor substrate with a plating solution which contains aggregates of a supercritical fluid and a solution of a plating metal ion and an electrolyte. The first surface includes a recess. The surface is along with a shape of the recess. The recess has a first dimension and a second dimension, and assuming that an aspect ratio of the recess is given as a ratio of the second dimension to the first dimension, a median of a particle size distribution of the aggregates is greater than the first dimension.

7 Claims, 7 Drawing Sheets

(56) References Cited

U.S. PATENT DOCUMENTS

2016/0273121 A1\* 9/2016 Higuchi ................ C25D 5/003

OTHER PUBLICATIONS

Higuchi et al., "Electrochemical Investigation of Cu Electroplating with Supercritical $CO_2$ Emulsion Using a Rotating Disk Electrode under High Pressure", Journal of The Electrochemical Society, 167, 162506, 2020, 7 Pages.

Mizushima et al., "Nanograin Deposition via an Electroplating Reaction in an Emulsion of Dense Carbon Dioxide in a Nickel Electroplating Solution using Nonionic Fluorinated Surfactant", Surface and Coatings Technology, vol. 194, No. 1, 2005, 8 Pages.

Worthen et al., "Carbon Dioxide-in-Water Foams Stabilized with Nanoparticles and Surfactant Acting in Synergy", Tribute to Founders: Neal R. Amundson. Soft Matter: Synthesis, Processing and Products, AIChE Journal, vol. 59, No. 9, Sep. 2013, 12 Pages.

Josell et al., "Modeling Extreme Bottom-Up Filling of Through Silicon Vias", Journal of The Electrochemical Society, vol. 159 No. 10, 2012, 7 Pages.

\* cited by examiner

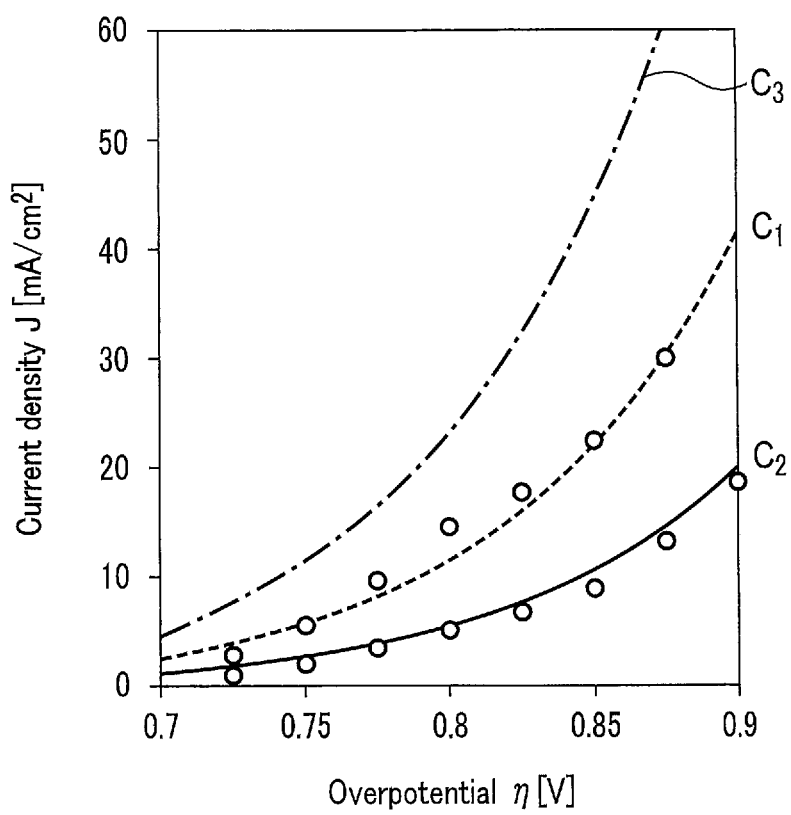
F I G. 5

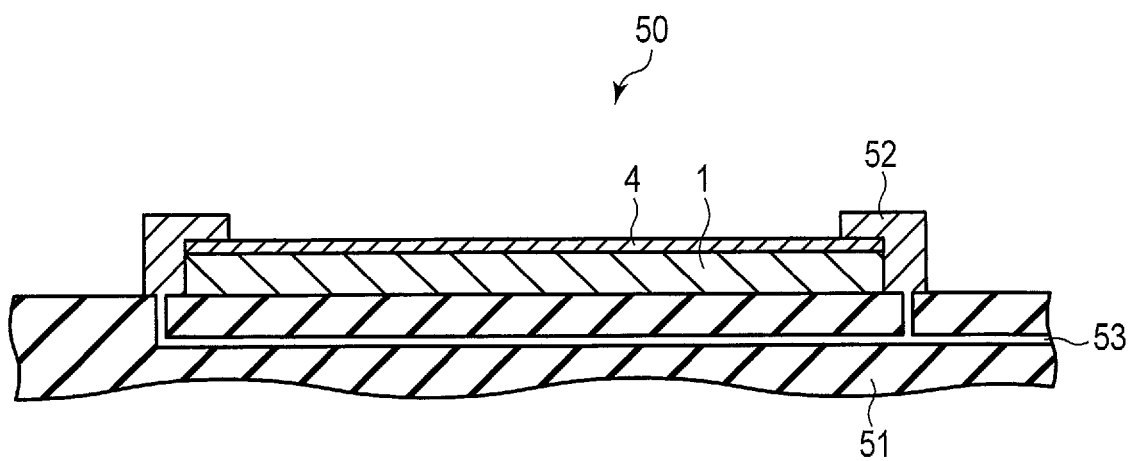
F I G. 10
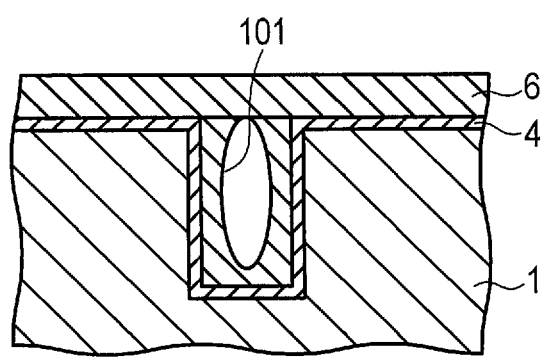
F I G. 11

METHOD FOR MANUFACTURING SEMICONDUCTOR DEVICE

CROSS-REFERENCE TO RELATED APPLICATIONS

This application is based upon and claims the benefit of priority from Japanese Patent Application No. 2021-149601, filed Sep. 14, 2021, the entire contents of which are incorporated herein by reference.

FIELD

Embodiments described herein relate generally to a method for manufacturing a semiconductor device.

BACKGROUND

Through-silicon-vias (TSVs) have been reducing their via hole diameters over the years in line with the advancement in integration of semiconductor devices, and it is even expected that TSVs of φ5 µm or smaller will be demanded in the future. Supposing that a chip has a thickness of, for example, 50 µm, the aspect ratios of such via holes will reach 10 or greater. In order for electroplating to fill the via holes having such high aspect ratios without creating a gap, a bottom-up growth technique is required which sees plating speeds controlled in such a manner that plating for the bottom of the holes is performed at a higher rate than it is for the surface.

BRIEF DESCRIPTION OF THE DRAWINGS

FIG. 5 is a graph showing current-voltage characteristics of plating solutions varying in volume percentage of supercritical $CO_2$.

FIG. 10 is a sectional view schematically showing a structure of an exemplary cathode in the electroplating apparatus shown in FIG. 9.

FIG. 11 is a schematic diagram showing one example of a semiconductor substrate subjected to electroplating by a method according to a comparative example.

DETAILED DESCRIPTION

Figure 1:
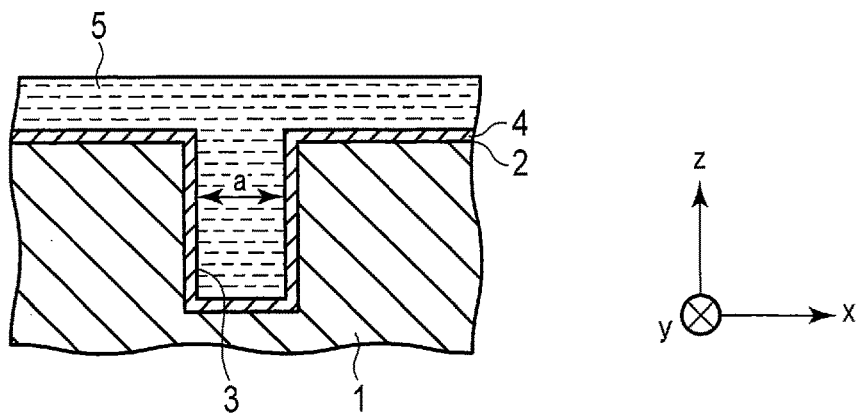
FIG. 1 is a sectional view schematically showing an exemplary step included in a method according to an embodiment.

In general, according to one embodiment, there is provided a method for manufacturing a semiconductor device. The method includes metal electroplating on a surface of a first electrode formed on a first surface of a semiconductor substrate with a plating solution which is in contact with at least the first electrode and which contains aggregates of a supercritical fluid and a solution of a plating metal ion and an electrolyte. The first surface of the semiconductor substrate includes a recess. The surface of the first electrode is along with a shape of the recess. The recess has a first dimension and a second dimension, and assuming that an aspect ratio of the recess is given as a ratio of the second dimension to the first dimension, a median of a particle size distribution of the aggregates of the supercritical fluid is greater than the first dimension.

According to the embodiment, a method for manufacturing a semiconductor device, which suppresses processing defects even in the cases with recesses having high aspect ratios, can be provided.

A method for manufacturing a semiconductor device according to the embodiment employs an electroplating technique which uses: a semiconductor substrate with a first surface including a recess; a first electrode formed on the first surface substantially in conformity with the shape of the recess; and a plating solution in contact with at least the first electrode and containing aggregates of a supercritical fluid and a solution of a plating metal ion and an electrolyte. The method includes performing, by this electroplating technique, metal plating on the surface of the first electrode. Also, the recess has a first dimension and a second dimension, and assuming that the aspect ratio of the recess is given as a ratio of the second dimension to the first dimension, a median of the particle size distribution of the supercritical fluid aggregates is greater than the first dimension. The second dimension of the recess is, for example, the depth of the recess. The first dimension of the recess is, for example, a dimension along the direction crossing (e.g., orthogonal to) the depth direction of the recess.

The electroplating is performed, for example, in such a manner as to immerse an anode and a cathode in a reaction vessel containing the plating solution, where the first electrode is employed as the cathode.

The method according to the embodiment will be described with reference to FIGS. 1 to 4.

The semiconductor here is selected from, for example: silicon (Si); germanium (Ge); a semiconductor made of a compound of Group III element and Group V element such as gallium arsenide (GaAs) and gallium nitride (GaN); and silicon carbide (SiC). In one example, the semiconductor substrate includes silicon. Note that the term "Group" used herein refers to a group in the short-form periodic table.

The semiconductor substrate is, for example, a semiconductor wafer. The semiconductor wafer may be doped with an impurity or impurities, and may be provided with one or more semiconductor devices including a transistor, a diode, etc. The semiconductor wafer has a main surface which may be in parallel with any crystal plane of the semiconductor. For example, the semiconductor wafer may be a silicon wafer having a (100) plane as the main surface, or a silicon wafer having a (110) plane as the main surface.

As shown in FIG. 1, a semiconductor substrate 1 has a main surface 2 which is the first surface and extends along the x-y plane, and a recess 3 is provided in this main surface 2. The recess 3 is, for example, a via hole. The recess 3 has a depth in the thickness direction of the semiconductor substrate 1, which is along the z-axis direction. Assuming that the diameter (hole diameter) of the recess 3 is expressed as value a, the aspect ratio of the recess 3 is given as a ratio of the depth (the second dimension) to the diameter value a (the first dimension). Note that the semiconductor substrate 1 may include more than one recess 3 in the main surface 2 extending along the x-y plane.

In the semiconductor substrate 1, a first electrode 4 is formed on the main surface 2 extending along the x-y plane in such a manner that the surface of the first electrode 4 is along with the shape of the recess 3. In other words, the first electrode 4 is formed on the main surface 2 of the semiconductor substrate 1 that extends along the x-y plane, and also on the side wall surface and the bottom surface of the recess 3. The first electrode 4 may function as an adhesion layer for enhancing the adhesion between the semiconductor substrate 1 and a plating layer. The first electrode 4 may be constituted by, for example, a Ti/Cu- or Ti/Ni/Pd-stacked film. Note that Ti here may be replaced with Cr. In one example, the first electrode 4 is formed through a spattering process, a deposition process, or the like. Also, for implementing plating on a pattern, a resist pattern or patterns which include openings at only the locations for plating may be formed on the first electrode 4.

A plating solution 5 is in contact with at least the first electrode 4. The plating solution 5 is, for example, a mixture plating solution containing a solution of a plating metal ion and an electrolyte (hereinafter, a "first solution") and aggregates of a supercritical fluid. As an example of the plating metal, at least one selected from Cu, Ni, Ag, a Cu alloy, an Ni alloy, and/or an Ag alloy may be used. Examples of the first solution include a copper sulfate plating solution containing copper sulfate pentahydrate and sulfuric acid, a copper pyrophosphate plating solution containing copper pyrophosphate and potassium pyrophosphate, a nickel sulfamate plating solution containing nickel sulfamate and boron, and so on.

The "supercritical fluid" refers to a fluid which does not belong to any of the solid, liquid, and gaseous states according to the substance state diagram defined by temperatures and pressures. The supercritical fluid is mainly characterized by its high diffusivity, high density, zero surface tension, etc., and allows for expectations of a nano-level permeability and a high reactivity over the processes using normal liquids. Examples of the supercritical fluid include supercritical $CO_2$. The critical point for $CO_2$ to turn into a supercritical state is a temperature of 31° C. and a pressure of 7.4 MPa, and $CO_2$ exists as a supercritical fluid at the temperature and pressure equal to or higher than these values.

Examples of the aggregates of a supercritical fluid include micelles of supercritical $CO_2$.

The plating solution 5 may contain, as an additive, at least one of an organic material having a compatibility with supercritical $CO_2$ and water, and/or a surfactant. While supercritical $CO_2$ does not mix with an electrolyte-containing aqueous solution, addition of such an additive or additives exerts an emulsifying effect so that a supercritical $CO_2$ emulsion (SCE) can be obtained. Examples of the surfactant include polyethylene oxide alkyl ether. Also, examples of the organic material exhibiting compatibility with supercritical $CO_2$ and water include polyethylene glycol. With the additive serving to reduce the boundary tension of supercritical $CO_2$, the supercritical $CO_2$ micelles tend to decrease their particle sizes.

In the plating solution 5, the volume percentage of the supercritical fluid in the total volume constituted by the first solution and the supercritical fluid may be adjusted to 50% by volume or below. This contributes to the realization of stable electroplating. If the volume percentage of the supercritical fluid exceeds 50% by volume, an emulsion in the form of the first solution dispersed in the supercritical fluid will result, and current flow stability will be hampered. For the volume percentage of the supercritical fluid in the range of 50% by volume or below, the particle sizes of the supercritical fluid aggregates tend to decrease as the volume ratio of the supercritical fluid becomes small. It is preferable that the volume percentage of the supercritical fluid in the total volume constituted by the first solution and the supercritical fluid be adjusted to 5% by volume or greater. This enables the realization of a reduced kinetic viscosity of the plating solution 5 and also an increased diffusion constant of the plating metal ions. As such, it is preferable that the volume percentage of the supercritical fluid in the total volume constituted by the first solution and the supercritical fluid be 5% by volume or greater and 50% by volume or below. A more preferable range of the volume percent is 5% by volume or greater and 30% by volume or below.

Figure 2:
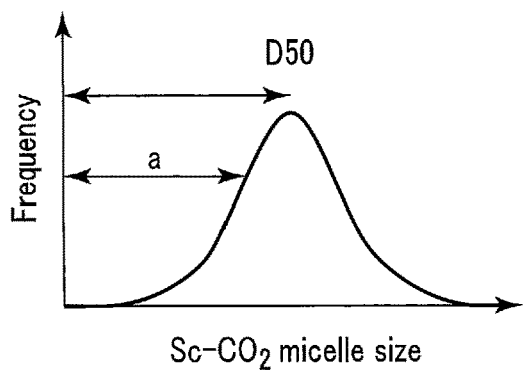
FIG. 2 is a diagram showing a volumetric distribution of particle sizes of supercritical $CO_2$ micelles.

Note that the median (D50) of the particle size distribution of the supercritical fluid aggregates is adjusted to be greater than the first dimension of the recess. When the recess is a via hole, the first dimension of the recess is a diameter (value a) of the via hole. When the recess is a groove, the first dimension is a width of the groove, as the aspect ratio of the recess is given as a ratio of the groove depth (the second dimension) to the groove width (the first dimension). For example, assuming that a groove along the y-axis direction is formed in the main surface of the semiconductor substrate 1 that extends along the x-y plane, the width of the groove in the x-axis direction, that is, the shorter width, is the first dimension. The semiconductor substrate 1 may be provided with any number of via holes, grooves, or via holes and grooves in combination. FIG. 2 shows the relationship between the D50 value of the particle size distribution (in this case, particle diameter distribution) of the supercritical $CO_2$ micelles and the diameter value a of the recess 3. By adjusting the particle size (particle diameter) (D50) of the supercritical $CO_2$ micelles to be greater than the diameter value a, the concentration of the supercritical $CO_2$ micelles within the recess 3 can be made smaller than the concentration of the supercritical $CO_2$ micelles outside the recess 3 (e.g., at the main surface 2 of the semiconductor substrate 1).

FIG. 5 shows current-voltage characteristics of plating solutions each corresponding to the plating solution 5 but having different volume percentages of supercritical $CO_2$ contents from one another. The horizontal axis in FIG. 5 indicates an overpotential η (V), and the vertical axis indicates a current density J (mA/cm$^2$). Here, the current-voltage curve for the plating solution 5 containing 10% by volume of supercritical $CO_2$ is $C_1$, the current-voltage curve for the plating solution 5 containing 30% by volume of supercritical $CO_2$ is $C_2$, and the current-voltage curve for the plating solution 5 containing no supercritical $CO_2$ is $C_3$. As apparent from FIG. 5, each of the current-voltage curve $C_1$ and the current-voltage curve $C_2$ is of a current density lower than that of the current-voltage curve $C_3$. It is therefore understandable that an increase in supercritical $CO_2$ concentration in the plating solution 5 leads to suppression of electrocrystallization. Accordingly, it is possible to mitigate the electrocrystallization suppression effect of the supercritical $CO_2$ by decreasing the concentration of the micelles of supercritical $CO_2$ within the recess 3. The plating rate within the recess 3 can therefore be increased.

Figure 3:
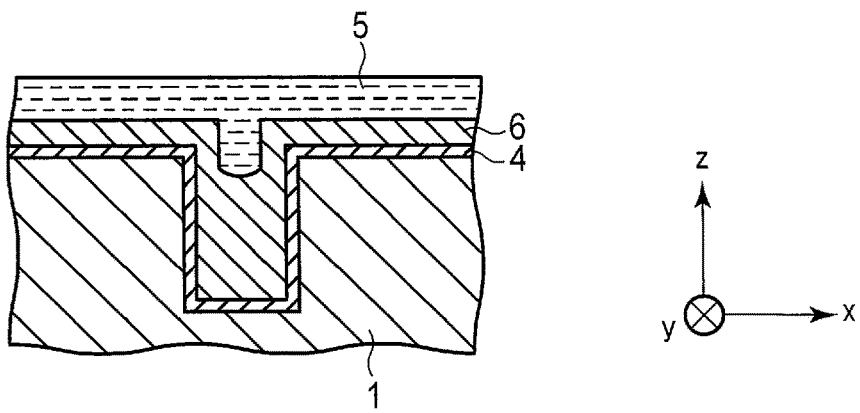
FIG. 3 is a sectional view schematically showing an exemplary step included in the method according to the embodiment.
Figure 4:
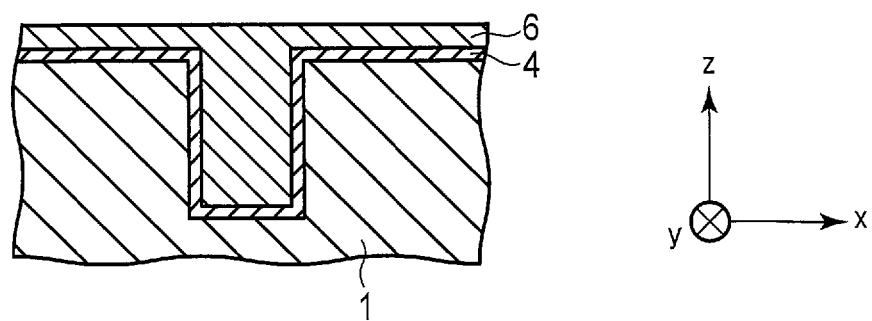
FIG. 4 is a sectional view schematically showing an exemplary step included in the method according to the embodiment.

Meanwhile, the supercritical $CO_2$ itself can reduce the kinetic viscosity of the plating solution and also can increase the diffusion constant of the plating metal ions. This can promote the ion supply to the places within the recess 3 and consequently enables deposition of the plating layer to be continued without exhausting the ions within the recess 3. For example, as illustrated in FIG. 3, the deposition of a plating layer 6 progresses upward in the z-axis direction, from the bottom part defining the recess 3. Then, as illustrated in FIG. 4, the plating layer 6 can fill the recess 3 without leaving a gap.

As described above, by adjusting the median of the particle size (particle diameter) distribution of the supercritical $CO_2$ micelles to be greater than the first dimension (e.g., the diameter value a) of the recess 3, the concentration of the supercritical $CO_2$ micelles within the recess 3 can be made smaller than the concentration of the supercritical $CO_2$ micelles outside the recess 3. As a result, plating within the recess 3 can be accelerated. Moreover, ion supply to the places within the recess 3 is promoted, and therefore, deposition of the plating layer can be continued without exhausting the ions within the recess 3. Accordingly, processing defects in the cases with the recess 3 having a high aspect ratio can be suppressed.

A description will be given of a method for measuring the particle size distribution of supercritical fluid aggregates. This method uses a pressure vessel having a transparent window that allows for optical measurement from outside. Supercritical fluid aggregates contained in the plating solution 5 in the vessel are optically observed. Optical micrographs are taken and image data analysis is performed with the "Image) software" so that particle diameters of the aggregates can be obtained (see Andrew J. Worthen et al., "Carbon Dioxide-in-Water Foams Stabilized with Nanoparticles and Surfactant Acting in Synergy", AIChE Journal, September 2013, Vol. 59, No. 9: for example, page 3493, left column). As the pressure vessel, a high-pressure view cell with two sapphire windows may be used (see Aya Mizushima et al., "Nanograin deposition via an electroplating reaction in an emulsion of dense carbon dioxide in a nickel electroplating solution using nonionic fluorinated surfactant", Surface & Coatings Technology 194 (2005) 149-156: page 150 and FIG. 2).

The aspect ratio of the recess is not limited to a particular value, but may be set to any value greater than 0. As one example, the aspect ratio may be 1 or greater.

The method according to the embodiment may include a step of removing oxides present on the surface of the first electrode prior to the electroplating step. The method may also include a washing step and a drying step after the electroplating step.

Figure 6:
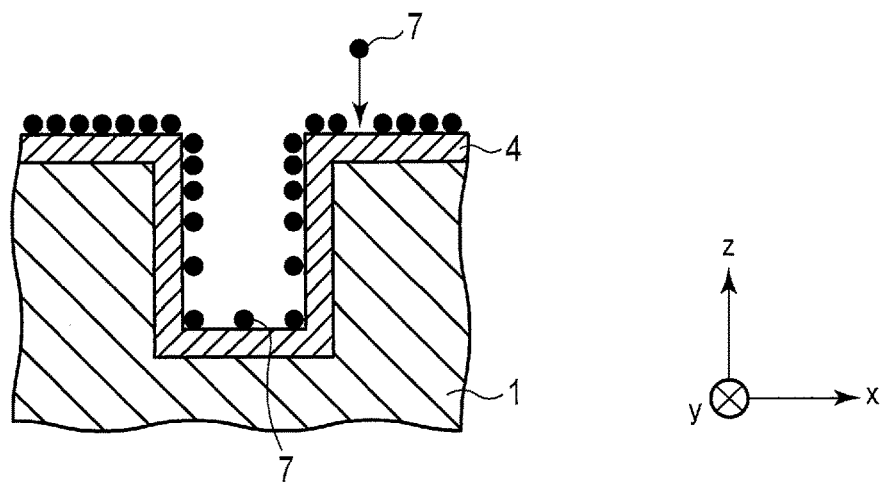
FIG. 6 is a sectional view schematically showing a plating process by a method according to a reference example.
Figure 7:
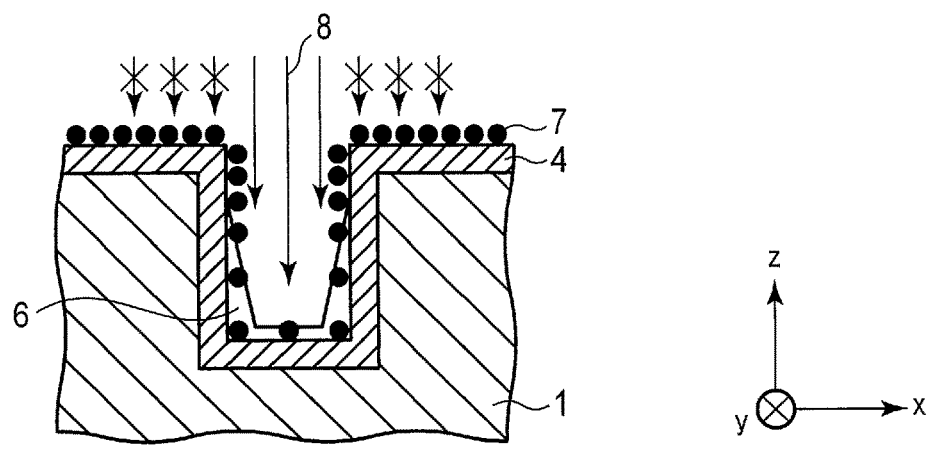
FIG. 7 is a sectional view schematically showing the plating process by the method according to the reference example.
Figure 8:
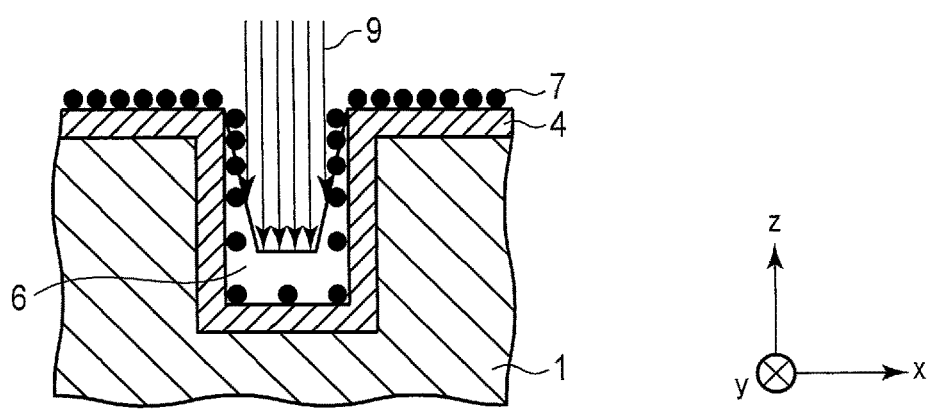
FIG. 8 is a sectional view schematically showing the plating process by the method according to the reference example.

There has been a proposal for adding, as a plating inhibitor, an organic material to a plating solution when electroplating is performed to fill a recess in a semiconductor substrate with a conductive material. Examples of such an organic material include polyethylene glycol (PEG). FIGS. 6 to 8 will be referred to for discussion of such a form of implementation as a reference example. The members similar to those shown in FIG. 2 are denoted by the same reference symbols and their detailed explanation will be omitted. As shown in FIG. 6, a plating inhibitor 7 constituted by the organic material is adsorbed onto the first electrode 4 which is formed on the main surface of the semiconductor substrate 1 that extends along the x-y plane and also on the side wall surface and the bottom surface defining the recess 3. The rate of this adsorption depends on the diffusing behavior of the inhibitor 7, and as such, the amount of adsorption to the bottom region in the recess 3 is smaller than the amount of adsorption to the top region of the recess 3. This leads to an increased density of electric currents 8 at the bottom region in the recess 3 and accordingly accelerates deposition of the plating layer 6 on the bottom part of the recess 3 as shown in FIG. 7. Subsequently, the inhibitor 7 located on the bottom region in the recess 3 is buried in the plating layer 6, making the currents 9 denser and causing the growth of the plating layer 6. The flow of this process is called a "positive feedback model". Here, the metal ions are contained in the plating solution at a concentration higher than that of the inhibitor 7, but the supply of metal ions is left dependent on their diffusing behavior. Thus, an increase in the aspect ratio of the recess 3 would incur a situation where the metal ions are exhausted at the bottom region in the recess 3, to which the convection of the plating solution does not extend, and a processing defect which substantially blocks formation of the plating layer occurs.

Figure 9:
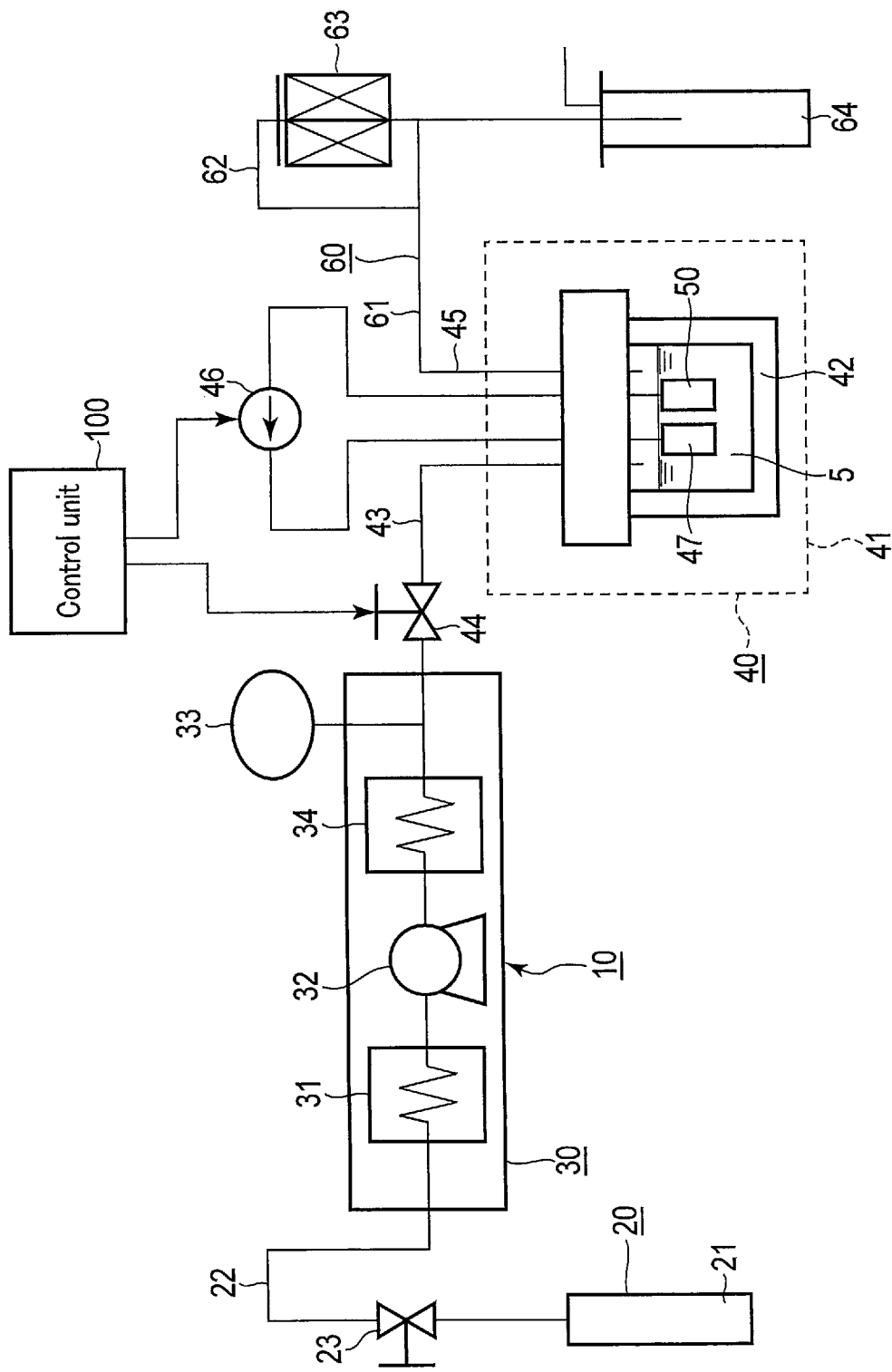
FIG. 9 is a diagram showing a general configuration of an exemplary electroplating apparatus employed in the method according to the embodiment.

An exemplary electroplating apparatus which may be employed in the method according to the embodiment will be described with reference to FIGS. 9 and 10.

An electroplating apparatus 10 includes a carbon dioxide supply unit 20, a temperature control pump 30, a plating treatment unit 40, a discharge unit 60, and a control unit 100 adapted to take total control over these units.

The carbon dioxide supply unit 20 includes: a carbon dioxide cylinder 21 storing high-pressure carbon dioxide; a supply pipe 22 with one end connected to the carbon dioxide cylinder 21 and another end connected to the temperature control pump 30; and a supply valve 23 for controlling the flow rate in the supply pipe 22.

The temperature control pump 30 includes: a cooler 31 adapted to cool and liquefy a carbon dioxide gas supplied from the supply pipe 22; a compressor 32 adapted to compress the liquefied carbon dioxide; a heater 34 adapted to heat the liquefied carbon dioxide; and a manometer 33 connected to the exit side of the heater 34.

The heater 34 heats carbon dioxide to its critical temperature 31.1° C. or higher. The compressor 32 pressurizes a liquefied carbon dioxide to a predetermined pressure, for example, its critical pressure 7.38 MPa or higher.

The plating treatment unit 40 includes: a temperature-controlled bath 41; a reaction bath 42 disposed in the temperature-controlled bath 41 and retaining a plating solution in use; a supply pipe 43 with one end connected to the exit of the heater 34 and another end connected to the inside of the reaction bath 42; a control valve 44 for controlling the flow rate in the supply pipe 43; an exit pipe 45 with one end connected to the inside of the reaction bath 42 and another end connected to the discharge unit 60; a DC constant current source 46 for current conduction; an anode 47 disposed in the reaction bath 42 and connected to the positive electrode side of the DC constant current source 46; and a cathode 50 disposed in the reaction bath 42 and connected to the negative electrode side of the DC constant current source 46.

As the reaction bath 42, a stainless pressure vessel having an inner wall coated with Teflon (registered trademark) may be used. The reaction bath 42 retains the plating solution 5.

As the anode 47, a plate made of a metal same as the plating metal may be mainly used. The anode 47 is electrically coupled with a lead electrically connected to the positive electrode of the power source for current conduction.

The cathode 50 includes, as shown in FIG. 10: a support plate 51; a semiconductor substrate 1 and a first electrode 4 which are disposed above the support plate 51; a claw 52;

and a lead 53. The semiconductor substrate 1 and the first electrode 4 are of the same constitution as those shown in FIG. 1. The claw 52 is, for example, a metal spring fixed onto the support plate 51. The claw 52 holds the semiconductor substrate 1 on which the first electrode 4 is formed, from the side surface and the main surface periphery of the semiconductor substrate 1, so that the semiconductor substrate 1 and the first electrode 4 are pressed against the support plate 51. As the claw 52 contacts the first electrode 4, an electrical connection is established between the claw 52 and the first electrode 4. The lead 53 is arranged in the support plate 51, and one end of the lead 53 is electrically connected to the claw 52 and another end is electrically connected to the negative electrode of the power source. The first electrode 4 is energized from the negative electrode of the power source through the lead 53 and the claw 52.

The discharge unit 60 includes: a discharge pipe 61 with one end connected to the exit pipe 45 and another end connected to a treatment vessel 64; a branch pipe 62 branching off from the discharge pipe 61; a back pressure regulating valve 63 disposed on the branch pipe 62; and the treatment vessel 64.

Examples of the electroplating performed with the electroplating apparatus 10 constituted as above will be set forth.

Example 1

A silicon wafer was prepared as the semiconductor substrate 1. A via having a hole size (diameter value a) of 10 μm and a depth of 50 μm (i.e., an aspect ratio of 5) was formed as the recess 3 in the main surface of the semiconductor substrate 1 using an exemplary technique, dry etching. Spattering was performed so that the first electrode 4 constituted by a stack of a Ti layer having a thickness of 100 nm and a Cu layer having a thickness of 500 nm was formed on the main surface of the semiconductor substrate 1. The Cu layer was arranged on the surface side of the first electrode 4 so as to be in contact with the plating solution 5. Note that Ti here may be replaced with Cr. The substrate member thus obtained was immersed in an aqueous solution containing 10% by weight of $H_2SO_4$ for one minute as a plating pretreatment. The purpose of this pretreatment was to remove natural oxides formed on the surface of the first electrode 4. Desirably, the type and composition of the pretreatment solution, as well as the treatment time should be changed as appropriate depending on the growth state of the oxides so that the oxide removal can be securely performed.

The substrate member and an anode were set in the reaction bath 42. As the anode, a pure Cu plate was used. The plating solution 5 was provided in the reaction bath 42, and the reaction bath 42 was tightly sealed with a lid. As the first solution, an aqueous solution mixing copper sulfate at 250 g/L, sulfuric acid at 50 mL/L, Cl ion at 60 mg/L, and polyethylene glycol at 1 g/L was prepared.

For $CO_2$, a cylinder of liquefied 4N $CO_2$ was used. The temperature of $CO_2$ was controlled to 40° C., and the inside of the reaction bath 42 was adjusted to 10 MPa using a high-pressure pump and a back pressure control. The reaction bath 42 was placed in the temperature-controlled bath 41 and also controlled to 40° C. The internal pressure of the supply pipe 43 connected to the control valve 44 was 10 MPa as well. Note that the volume ratio between the first solution and $CO_2$ was adjusted to 7:3, in other words, adjusted so that the $CO_2$ portion accounted for 30% by volume. Calculation of the volume ratio between the first solution and $CO_2$ can be done in such a manner that a value obtained by subtracting the volume of the first solution from the internal volume of the reaction bath 42 is adopted as the $CO_2$ volume. The critical point for $CO_2$ to turn into a supercritical state is a temperature of 31° C. and a pressure of 7.4 MPa, but this example used margins of +9° C. for the critical temperature and +2.6 MPa for the critical pressure in order to assure that the $CO_2$ within the reaction bath 42 was securely placed in the supercritical state. Such margin values may be discretionarily determined according to the temperature, the pressure distribution, etc. in the reaction bath 42.

It was confirmed that the internal pressure and temperature of the reaction bath 42 became predetermined values and stabilized. The plating solution 5 was present in the reaction bath 42 as a mixture of the first solution and the supercritical $CO_2$ micelles. The median (D50) of the particle size (particle diameter) distribution of the supercritical $CO_2$ micelles was 30 μm, which was greater than the hole size (diameter value a) of the recess 3.

The DC constant current source 46 was turned on to conduct the plating current at a constant value and for a predetermined period. The plating current was adjusted to have a cathode current density of 10 mA/cm². After the current conduction for the predetermined period, the inside of the reaction bath 42 was returned to a normal pressure and the substrate member having a Cu coating thereon was taken out and subjected to water washing and drying steps.

No processing defects occurred in the Cu plating formed in the recess 3.

Example 2

As the first solution, an aqueous solution mixing nickel sulfate at 370 g/L, nickel chloride at 90 g/L, boric acid at 100 g/L, and polyethylene oxide alkyl ether at 10 g/L was prepared. As the anode, a pure Ni plate was used.

Electroplating was performed in the same manner as Example 1 except that the first solution and the anode differing as above were used. No processing defects occurred in the Ni plating formed in the recess 3.

Comparative Example

The internal temperature of the reaction bath 42 was controlled to 50° C., and the median (D50) of the particle size (particle diameter) distribution of the supercritical $CO_2$ micelles was adjusted to 5 μm, which was smaller than the hole size (diameter value a) of the recess 3. Electroplating was performed in the same manner as Example 1 except these differences. Processing defects occurred in the Cu plating formed in the recess 3.

Figure 12:
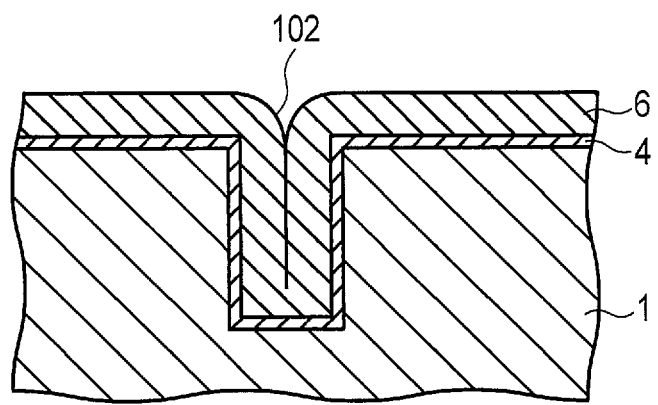
FIG. 12 is a schematic diagram showing another example of a semiconductor substrate subjected to the electroplating by the method according to the comparative example.

The processing defects that occurred in the cases according to this comparative example included, for example, creation of a void 101 in the plating layer 6 formed in the recess 3 as shown in FIG. 11, and creation of a seam 102 in the plating layer 6 formed in the recess 3 as shown in FIG. 12. It is assumed that these defects were due to the comparative example failing to decrease the micelle concentration within the recess 3, and as such, being incapable of increasing the plating rate within the recess 3 relative to the plating rate outside the recess 3.

According to the embodiment described above, a method for manufacturing a semiconductor device employs an electroplating technique which uses: a semiconductor substrate with a first surface including a recess; a first electrode formed on the first surface substantially in conformity with the shape of the recess; and a plating solution in contact with at least the first electrode and containing aggregates of a supercritical fluid and a solution of a plating metal ion and an electrolyte. The method includes performing, by this electroplating technique, metal plating on the surface of the first electrode. Also, the recess has a first dimension and a second dimension, and assuming that the aspect ratio of the recess is given as a ratio of the second dimension to the first dimension, a median of the particle size distribution of the supercritical fluid aggregates is greater than the first dimension. With this method for manufacturing a semiconductor device, processing defects can be suppressed even in cases with recesses having high aspect ratios.

While certain embodiments have been described, they have been presented by way of example only, and are not intended to limit the scope of the inventions. Indeed, the novel embodiments described herein may be embodied in a variety of other forms. Furthermore, various omissions, substitutions, and changes in the form of the embodiments may be made without departing from the spirit of the inventions. The accompanying claims and their equivalents are intended to cover such forms or modifications as would fall within the scope and spirit of the inventions.

The invention claimed is:

1. A method for manufacturing a semiconductor device, the method comprising metal electroplating on a surface of a first electrode formed on a first surface of a semiconductor substrate with a plating solution which is in contact with at least the first electrode and which contains aggregates of a supercritical fluid and a solution of a plating metal ion and an electrolyte, the first surface of the semiconductor substrate including a recess, the surface of the first electrode being along with a shape of the recess, wherein the recess has a first dimension and a second dimension, and assuming that an aspect ratio of the recess is given as a ratio of the second dimension to the first dimension, a median of a particle size distribution of the aggregates of the supercritical fluid is greater than the first dimension.

2. The method according to claim 1, wherein the aggregates of the supercritical fluid are micelles of supercritical $CO_2$.

3. The method according to claim 1, wherein the recess is a hole, a groove, or a combination thereof.

4. The method according to claim 3, wherein the first dimension is a diameter of the hole or a width of the groove.

5. The method according to claim 1, wherein a volume percentage of the supercritical fluid in a total volume constituted by the solution and the supercritical fluid is 50% by volume or below.

6. The method according to claim 1, wherein the plating metal ion is an ion of at least one metal selected from the group consisting of Cu, Ni, and Ag.

7. The method according to claim 1, wherein the first electrode has a negative electric potential.

* * * * *